METHOD AND DEVICE FOR MAKING CONNECTIONS IN TRANSISTORS

Filed Sept. 13, 1957 2 Sheets-Sheet 1

INVENTORS
ROBERT C. INGRAHAM
FRANK M. THOMAS
BY
Kenway, Jenney, Witter & Hildreth
ATTORNEYS

METHOD AND DEVICE FOR MAKING CONNECTIONS IN TRANSISTORS

Filed Sept. 13, 1957 2 Sheets-Sheet 2

INVENTORS
ROBERT C. INGRAHAM
FRANK M. THOMAS
BY
Kenway, Jenney, Witter & Hildreth
ATTORNEYS United States Patent Office 3,065,525
Patented Nov. 27, 1962

3,065,525

METHOD AND DEVICE FOR MAKING CONNECTIONS IN TRANSISTORS

Robert C. Ingraham, Topsfield, and Frank M. Thomas, Lynnfield, Mass., assignors, by mesne assignments, to Sylvania Electric Products Inc., Wilmington, Del., a corporation of Delaware Filed Sept. 13, 1957, Ser. No. 683,868
1 Claim. (Cl. 29—190)

This invention relates in general to the manufacture of transistors and in particular, to a method for making electrical connections to the active elements of transistors and to a jig or harness for use in employing such method.

The terms "working elements" or "active elements" as used above and in the following description of my invention have reference to the semiconductor (e.g., germanium or silicon) wafer or die, the conductivity type imparting dots or electrodes alloyed to the wafer or die and the ohmic or base connection element soldered to the die.

In many of the types of transistors currently being manufactured, particularly those designed for power output purposes, it is necessary that the heat developed in operation be conducted away from the working elements of the transistor as efficiently as possible. For this reason, it has become the practice to utilize a relatively massive header for supporting the active elements of the transistor, the header forming part of the envelope of the device and being made of a metal having good heat-conducting properties, such as copper. Usually, a pair of openings are formed through the header and heavy leads are sealed in glass or other insulating material through these openings. Electrical connection is required to each of the alloyed dots and to the base of the transistor, and the leads provide two of these connections while the header itself provides the third connection.

Most power transistors are of the junction type. Junction transistors generally include a thin, square or rectangular wafer or die of germanium, silicon or other semiconductor material. A dot of indium or other suitable conductivity type imparting material is alloyed more or less centrally to each flat side of the semiconductor die. The dots constitute electrodes or connections to the rectifying junctions of the device, which junctions are formed in the areas of alloying between the dots and the semiconductor material. In such transistors designed to operate at high powers, a substantial amount of heat is produced, particularly at the collector junction. To conduct this heat away as efficiently as possible, it has become common practice to solder the collector dot directly to the relatively massive header of the device. The emitter electrode and the base of the semiconductor die are usually connected to the heavy leads extending through the header by short relatively flexible leads.

The fabrication of transistors by a method which includes the above-described technique for making connections to the active or working elements of the device is tedious and time-consuming. It necessarily has involved numerous manual operations carried out consecutively. Frequently a connection made in an earlier operation is damaged in the process of making a subsequent connection, because of the close spacing of the parts of the device. Furthermore, contamination of parts and lack of uniformity in results unavoidably accompany manual operations and result in undesirably low yields of good quality devices. These objectionable features of the technique heretofore employed are reflected in excessive material and labor costs.

It is, therefore, an object of this invention to provide a method for fabricating transistors which reduces to a minimum the number of steps required to make the necessary connections in a transistor device.

It is a further object to provide a method for making connections to the active elements of a transistor which will afford greater uniformity between devices of the same type.

A still further and more specific object is to provide a method of making the connections between the active elements of a transistor and the external leads of the device which substantially reduces the number of individual connection elements.

It is also an object of this invention to provide a unitary connection member which is adapted to retain its position relative to the various active elements during formation of permanent connections to the elements without being held or jigged by external means.

In general, the present invention consists in a soldering technique and a connector clip designed to receive the working elements of a transistor and to connect them electrically to relatively heavy leads of a base member or header and to the header itself. The various contacting surfaces are soldered together, desirably in a single operation, to provide suitable electrical connections to the operating elements of the transistor. A portion of the connector clip which provides support to the clip and to the elements then is severed and bent to isolate electrically the various elements, or may be removed and discarded.

Among the features of the clip are its three point base so designed as to support the transistor working elements in a plane substantially parallel to the plane of the header and to eliminate rocking of the transistor elements prior to or during the soldering operations. Another feature of the clip is the function of the portions which are not severed or discarded, namely, the conduction of the desired currents between the leads and the operating transistor elements. Most important, the clip permits the soldering operation to be done with a minimum of manual operations. These and other objects, features, and advantages will become apparent from a reading of the following detailed description of a preferred embodiment of the invention selected for purposes of illustration and shown in the accompanying drawings, in which:

Figure 1:
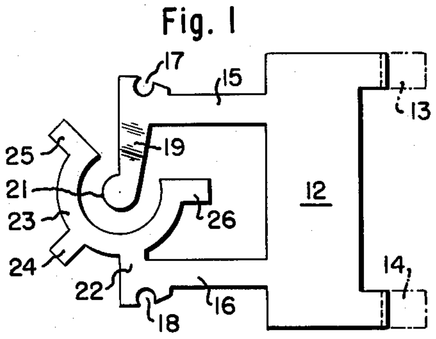
FIG. 1 is a top view of a preferred embodiment of the connector clip of the invention.
Figure 2:
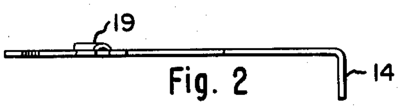
FIG. 2 is a side view of the same clip.

One form of the jig or connector clip is shown in FIGS. 1 and 2. It is preferably made of copper or brass and may be gold-plated to inhibit surface oxidation. The clip has a support portion 12 the extremity of which may be turned downwardly in its entirety or may have downwardly turned legs formed as shown at 13 and 14. Extending to the left from the support end 12, as shown in FIG. 1, are arms 15 and 16 which are quite narrow compared to the width of the support end 12. At the outer edges, near the ends of the arms, arcuate sections are cut out to form contact surfaces 17 and 18.

Opposite the arcuate contact surface 17, an extension 19 of the arm 15 runs inwardly toward the center line of the structure. The extension 19 is raised, as may be seen in FIG. 2, for a portion of its length. A rounded contact member 21 is formed at the end of extension 19. The other arm 16 also has an inward projection 22 opposite arcuate section 18 which terminates in a generally annular contact member 23. A section of contact member 23 is cut out to accommodate the extension 19. Formed integrally with contact member 23 are three tabs 24, 25 and 26, spaced about the periphery of member 23.

Figure 3:
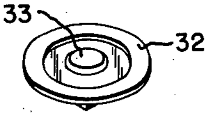
FIG. 3 is a perspective view of the assembled transistor working elements showing the disposition of components on the top surface.
Figure 4:
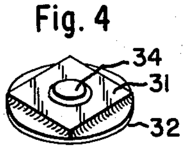
FIG. 4 is a perspective view of the assembly of FIG. 3 showing the disposition of components on the bottom surface.

In FIGS. 3 and 4 the working elements of the transistor as they are assembled for incorporation in the connector clip are shown. The semiconductor die 31 is soldered to a ring 32 which serves as a base connection for the device. Preferably, the ring is dipped in molten solder prior to connecting it to the die. This method provides solder on both surfaces of the ring for soldering to the die and also for later soldering to the connector clip. The ring 32 may be of nickel or Kovar or other suitable metal and the solder used is preferably lead-antimony to insure ohmic contact between the ring and the die, if a p-n-p type transistor is being made. Kovar is preferred as the metal of the base ring because its coefficient of expansion fairly nearly matches that of the semiconductor die. At the same time that the semiconductor die is soldered to the base ring, the emitter dot 33 which is typically of indium if a p-n-p type transistor is being made, is alloyed to the semiconductor die and the collector dot 34 is alloyed to the opposite side of the semiconductor die.

Figure 5:
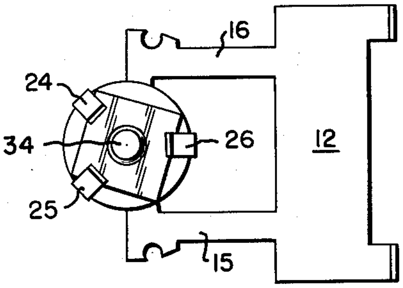
FIG. 5 is a bottom view of the connector clip having the transistor elements assembly clamped in place.

In FIG. 5, the assembly of the transistor working elements into the connector clip is shown. The three tabs 24, 25 and 26 which extend outwardly from the annular contact 23 are bent around the base ring 32 to hold the transistor elements tightly and to force the emitter dot 33 into intimate contact with the contact surface 21.

Figure 6:
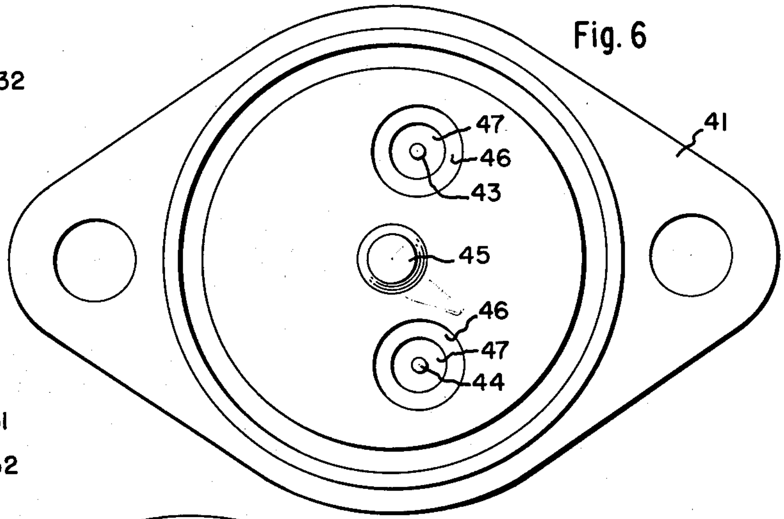
FIG. 6 is a top view of the header.

In FIG. 6 the top inner surface of the header 41 is shown. It is preferably of copper and may also be gold-plated in desired areas to inhibit surface oxidation. Compared to the transistor working elements, it is relatively massive to provide a heat sink for dissipating the heat which results from high power operation of the transistor. The header includes outwardly extending flanges through which mounting holes may be drilled as shown for supporting the entire device on a chassis or other foundation member. A pair of leads 43 and 44 extend through the header 41. These leads may be sealed to eyelets 46 of Kovar or other suitable material by means of a glass or other insulating sealing material 47 and the eyelets in turn may be welded or brazed in place in the header. Approximately in the center of the header 41 is an upraised pedestal 45. The pedestal 45 may be integral with the header or may be a unit welded or brazed in place as desired.

Figure 7:
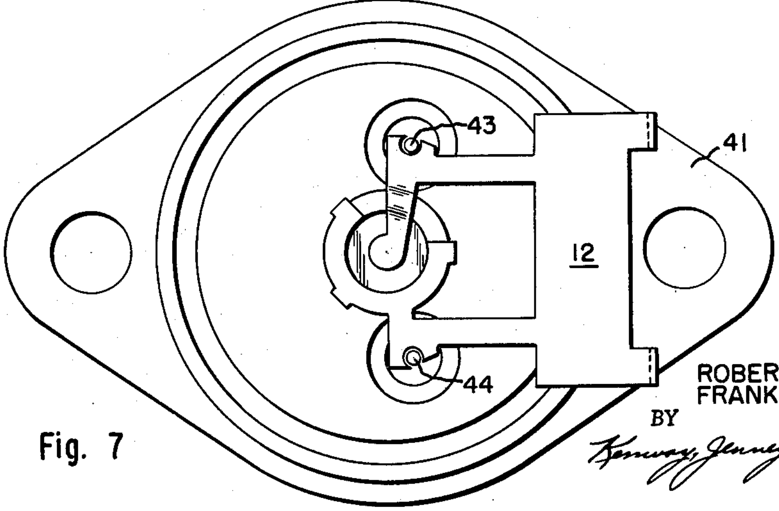
FIG. 7 is a top view of the header with the connector clip and transistor element assembly of FIG. 5 in place thereon prior to soldering.
Figures 8, 9, 10, 11:
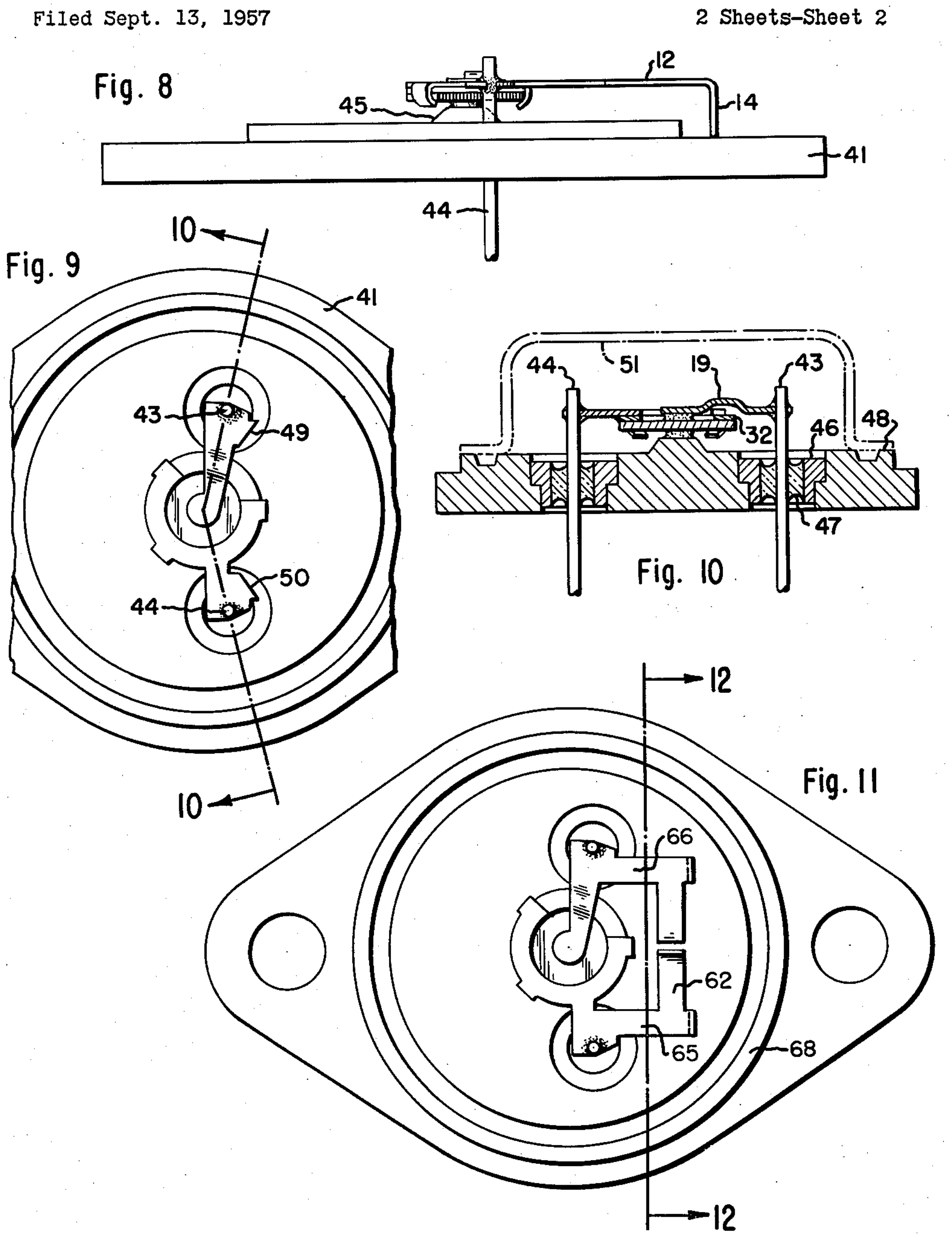
FIG. 8 is a side view of the assembly shown in FIG. 7.
FIG. 9 is a top view of the structures of FIG. 7 after soldering and removal of a portion of the connector clip.
FIG. 10 is a sectional view taken along the lines 10—10 of FIG. 9.
FIG. 11 is a top view of an alternative form of connector clip in place on a header.

In the plan view of FIG. 7 the placement of the connector clip and transistor element assembly on the header preparatory to the subsequent soldering of the various connections is shown. The dimensions and contours of the connector clip and its placement with respect to the header, cause the leads 43 and 44 to abut the arcuate surfaces 17 and 18 respectively, as shown. As may be more clearly seen in FIG. 8, the length of legs 13 and 14 and the height of the raised portion of the header or pedestal 45 are chosen such that the connector clip lies in a plane approximately parallel to the plane of the header. With the connector clip disposed as illustrated in FIG. 8, the collector dot 34 rests in contact with the pedestal 45. The pedestal thus forms the connection between the collector and the header. It can be clearly seen that with the three-point suspension system provided by legs 13 and 14 and the dot 34, not only is a stable footing achieved but also a large portion of the weight of the assembled clip and working elements is utilized to maintain a small but positive pressure contact between dot 34 and pedestal 45. The contact surface 21 is also in contact with the indium emitter dot 33 as noted above because of the slight pressure exerted by the tabs 24, 25 and 26, and extension 19.

A pair of solder rings (not shown) are dropped over leads 43 and 44 and rest on the top of the connector clip. The entire assembly is then placed in a hydrogen furnace or other reducing atmosphere where a free flow of gaseous reducing agent is provided to maintain the surfaces to be soldered free of oxides during the application of heat. The solder rings about the leads 43 and 44 melt during the application of heat, and upon cooling form bonding solder fillets between the leads and the arcuate contact surfaces 17 and 18 respectively. Both of the indium dots, the emitter dot 33, and the collector dot 34, also melt and flow to some extent in the furnace. Upon cooling, a good bond is obtained between the dots 33 and 34 and the contact member 21 and the pedestal 45, respectively. In addition, simultaneously, the annular contact member 23 becomes soldered to the base ring 32 because of the solder present on the ring.

In FIGS. 9 and 10 the soldered assembly of clip and header is illustrated after the arms 15 and 16 are cut. The cuts are usually made close to the leads, the cut ends being indicated at 49 and 50 respectively. The portions of the clip remaining in the assembly provide separate electrical paths, one from lead 43 to the emitter dot and one from lead 44 to the base ring 32. Parenthetically, it will be noted in FIG. 10 that the upraised portion of the extension 19 provides clearance between that extension and the base ring 32. The collector dot is of course connected directly to the pedestal on the header.

Although it forms no part of the present invention, a domed cap 51, shown in phantom in FIG. 10, is usually welded to the header. A flange is provided on the cap and it rests on the annular surface 48 to which it is welded desirably by a process wherein the heat may be localized, such as by an inert gas technique. The header and the cap constitute the envelope of the finished device.

Figure 12:
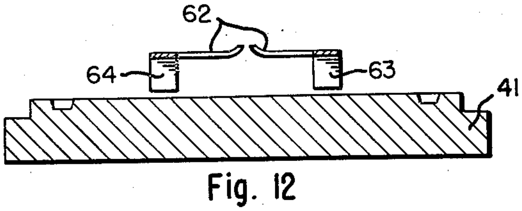
FIG. 12 is a sectional view taken along the line 12—12 of FIG. 11.

In FIGS. 11 and 12 an alternative embodiment of the present invention is illustrated. The connector clip is essentially the same as that previously described herein, as is the soldering process. However, the arms 65 and 66 are shortened and the support section 12 is narrowed to such an extent that the legs 63 and 64 contact the header well within the annular surface 68 before the soldering operation takes place.

However, after the soldering, the arms 65 and 66 are bent to raise the legs 63 and 64 from contact with the header. The support section 62 is severed and the desired conductive paths are thus set up between leads and transistor elements without any portion of the clip being discarded.

Although what has been shown and described constitute preferred embodiments of the invention, the intention is only to illustrate the invention. Numerous variations may well be made without departure from the principles of the invention which should be limited only by the spirit and scope of the appended claim.

What is claimed is:

A conductive harness for electrically connecting the working elements of an assembly of such elements of a transistor to a pair of leads extending through a header forming part of the envelope of said transistor and to a contact pedestal on said header, said harness comprising a sheet metal body including a support portion and a pair of arms extending from said support portion, each of said arms having two contact means, one of said contact means on one of the arms being provided with deformable tabs, and said support portion having a section thereof bent at an angle to the remainder of the support portion and the arms, whereby with one of the working elements of an assembly of transistor elements held by said tabs and another working element resting on said pedestal contact, the edge of said bent section of the support portion rests on said header to form a stable support for the harness and assembly of transistor elements on the header during soldering and connection of the contact means to the leads and active elements.

References Cited in the file of this patent

UNITED STATES PATENTS

| | | |
|---|---|---|
| 1,571,907 | McClanahan | Feb. 2, 1926 |
| 2,339,402 | Herzog | Jan. 18, 1944 |
| 2,744,308 | Loman | May 8, 1956 |
| 2,745,044 | Lingel | May 8, 1956 |
| 2,762,001 | Kilby | Sept. 4, 1956 |
| 2,838,722 | Watson | June 10, 1958 |
| 2,850,687 | Hammes | Sept. 2, 1958 |